United States Patent [19]

Ogura

[11] Patent Number: 5,217,540

[45] Date of Patent: Jun. 8, 1993

[54] SOLAR BATTERY MODULE

[75] Inventor: Hiroshi Ogura, Osaka, Japan

[73] Assignee: Sharp Kabushiki Kaisha, Osaka, Japan

[21] Appl. No.: 764,218

[22] Filed: Sep. 23, 1991

[30] Foreign Application Priority Data

Oct. 9, 1990 [JP] Japan .............................. 2-106283[U]

[51] Int. Cl.$^5$ .......................................... H01L 31/048
[52] U.S. Cl. ................................................... 136/251
[58] Field of Search .......................................... 136/251

[56] References Cited

U.S. PATENT DOCUMENTS

| 3,982,963 | 9/1976 | Mahoney et al. | 136/251 |
| 4,966,631 | 10/1990 | Matlin et al. | 136/244 |

FOREIGN PATENT DOCUMENTS

| 63-198346 | 12/1988 | Japan | 136/251 |
| 64-52838 | 3/1989 | Japan | 136/251 |

Primary Examiner—Aaron Weisstuch

[57] ABSTRACT

A solar battery module to be mounted on a mounting face of a mounting body, comprising a solar battery module body, solar cells for converting sunlight into electric energy inside the solar battery module body, a connection lead wire connected with the solar cells and which passes through a hole in the mounting surface, fasteners passing through the holes in the mounting surface for mounting the solar battery module body to the mounting face, and spacers provided in the vicinity of the fasteners and the connection lead wire for contacting the mounting face and preventing water from flowing into the mounting body and the solar battery module body, wherein the spacers include a soft resin which can conform to the shape of the mounting face, and a sealing resin, which is adherent and waterproof, provided on both faces of the soft resin for covering a gap defined around the connection lead wire and the fastener so as to prevent water from flowing into the mounting body.

6 Claims, 4 Drawing Sheets

SOLAR BATTERY MODULE

BACKGROUND OF THE INVENTION

1. Field of the Invention

The present invention relates to a solar battery module, and more particularly to a solar battery module (solar battery charger) that includes a mounting mechanism.

2. Description of the Prior Art

Recently, the environment has been polluted by thermal power generation and nuclear power generation. Consequently, the cleanliness of sunlight power generation has come to public notice, so that sunlight power generation has come to be utilized gradually and widely. By way of example, there are many cases where a solar battery is provided for preventing a lead-acid battery of for example a yacht or a car from self-discharging. In particular, since marine sports are in vogue, a solar battery is frequently provided on a yacht, a boat, for example.

Conventionally, there have been provided a superstrate type solar battery module (solar battery charger) having a strengthened glass sheet 1 on its upper surface as shown in FIG. 6, and a substrate type solar battery module having a steel plate, an aluminum plate 2, for example, on its back surface as shown in FIG. 7.

In FIGS. 6 and 7, indicated at 3 is a solar cell for converting sunlight into electric energy, indicated at 4 is a transparent resin for encapsulating and protecting the solar cell 3, indicated at 5 is a film applied on the back of the transparent resin 4, and indicated at 6, is a transparent film applied on the surface of the transparent resin 4.

When using the solar battery, the method of the battery mounting becomes a problem. Most yachts and boats have curved mounting surfaces. On the other hand, both superstrate type and substrate type solar battery modules shown in FIGS. 6 and 7 are planar in shape. Consequently, a gap is defined between the module body and the mounting face. Accordingly, it is necessary to insert a spacer into the gap. When a planar module is mounted on the curved surface, the appearance is poor.

In the case where the solar battery is to be mounted reliably and tightly, bolts, machine screws, for example, are needed. When the solar battery is mounted, for example, by bolts, machine screws, etc., holes are formed in the outer walls of the yacht or the boat. Consequently, waterproofing is needed. Similarly, it is necessary to waterproof a hole through which a connection lead wire (output lead wire) passes. The power generated by the solar battery is supplied to the lead-acid battery through the connection lead wire.

Conventionally, a suitable spacer or waterproofing by use of silicone resin should be employed. However, these are very troublesome.

In most cases, the solar battery module is planar in shape. Consequently, a square or rectangular solar battery module occupies a large area. On the other hand, people frequently walk around on the yacht or boat. Consequently, the solar battery module is obstructive and may be tread on. Referring to the superstrate type solar battery shown in FIG. 6, when the strengthened glass 1 gets wet, it may be slippery. Referring to the substrate type solar battery shown in FIG. 7, thin film 6 is applied on the surface thereof. Consequently, the solar cell 3 may be damaged so that the power generation function may be lost.

It is an object of the present invention to provide a solar battery module which can easily be mounted, is tight and waterproof, and can maintain power generation even if it is washed by waves or is tread on.

SUMMARY OF THE INVENTION

The present invention provides a solar battery module (solar battery charger) to be mounted on a mounting face of a mounting body, comprising a solar battery module body, solar cells for converting sunlight into electric energy inside the solar battery module body, a connection lead wire which is connected with the solar cells and passes through a hole in the mounting face, fasteners for fitting the solar battery module body in the holes of the mounting face, and spacers provided in the vicinity of the fasteners and the connection lead wire of the solar battery module body for coming into contact with the mounting face and preventing water from flowing into the mounting body and the solar battery module body. The spacer includes a soft resin which can conform to the shape of the mounting face, and a sealing resin, which is adherent and waterproof, provided on both faces of the soft resin for covering a gap defined around the connection lead wire and the fastener so as to prevent water from flowing into the mounting body.

According to the present invention, in the situation where the solar battery module body is mounted on the mounting face of the mounting body, the fasteners are fitted in the holes and the connection lead wire penetrates through the hole.

In this situation, the spacer is provided in the vicinity of the fastener and the connection lead wire of the solar battery module body. Consequently, the soft resin of the spacer conforms to the shape of the mounting face, so that the sealing resin can automatically come into contact with the mounting face. Thus, a gap can easily be prevented from occuring between a solar battery module body and the mounting face.

The sealing resin is formed on the surface of the soft resin so as to cover the gap defined around the fastener and the connection lead wire. Accordingly, the solar battery module body can easily be mounted to prevent water from flowing into the mounting body.

In consideration of the foregoing, a solar battery module can be easily and tightly mounted on curved surfaces having various radii of curvature so that good waterproofing can be obtained.

DETAILED DESCRIPTION OF THE PREFERRED EMBODIMENTS

Figure 1:
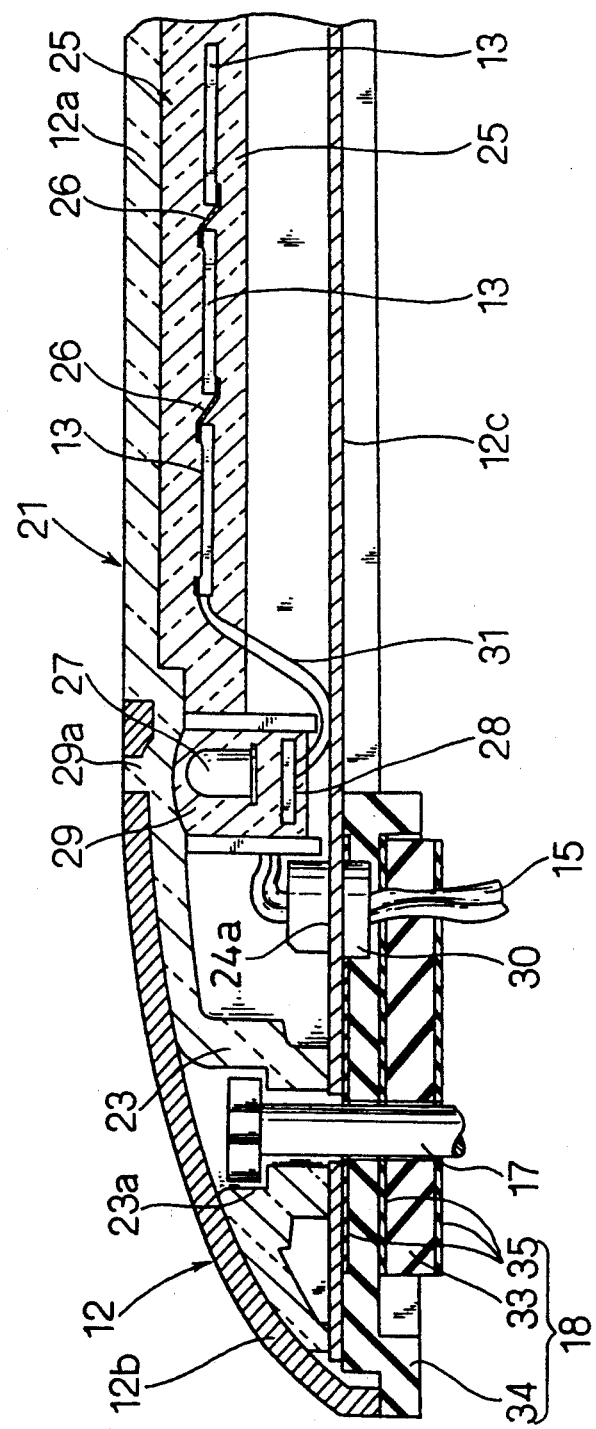
FIG. 1 is a section view of a solar battery module according to an embodiment of the present invention.

It is preferred that a spacer of the solar battery module according to the present invention be provided with a shock absorber for absorbing outer shocks on the lower face of the solar battery module body. In the case where the shock absorber is provided between the lower face of the solar battery module body and the mounting face of a mounting body, any shock to the solar battery module can be absorbed even if the solar battery module is washed by waves or is tread on.

An embodiment of the present invention will now be described with reference to the drawings.

As shown in FIGS. 1 to 5, a solar battery module of the present invention is mounted on a deck (a mounting face 11) of a hull (a mounting body) such as, for example, a yacht or a boat. The solar battery module comprises a solar battery module body 12, solar cells 13, a connection lead wire (an output lead wire) 15, and fasteners (bolts) 17. The solar cells 13 convert sunlight into electric energy in the solar battery module body 12. The connection lead wire 15 is connected with the solar cells 13 and penetrates through hole 14 of the mounting face 11. The solar battery module body 12 is mounted to the mounting face by bolts 17 fitted in holes 16 of the mounting face 11. A spacer 18 is provided in the vicinity of the bolt 17 and the output lead wire 15 of the solar battery module body 12. The spacer 18 contacts the mounting face 11 so as to prevent water from flowing into the mounting body and the solar battery module body 12.

Figure 3:
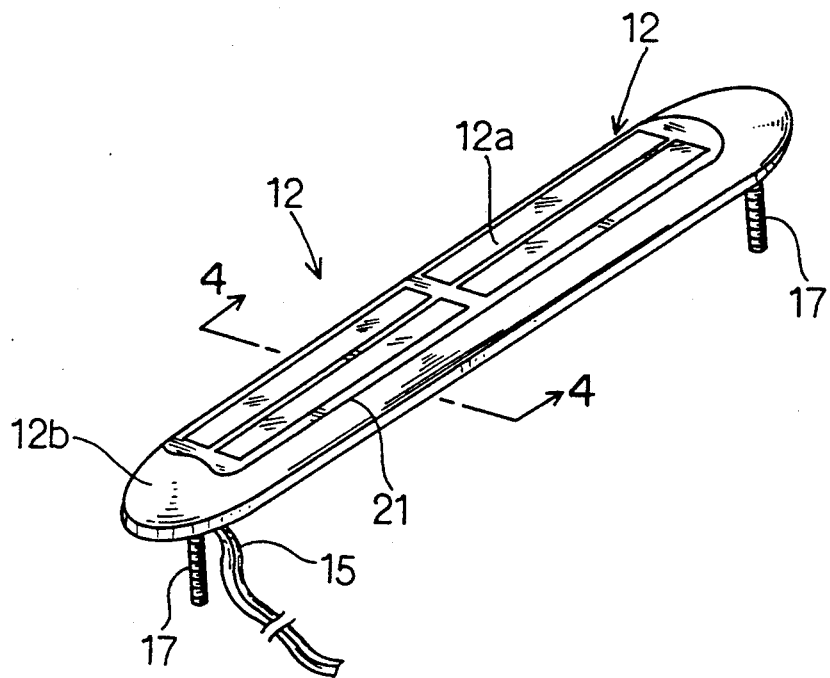
FIG. 3 is a perspective view showing the appearance of the whole solar battery module.

As shown in FIG. 3, the solar battery module body 12 has an aspect ratio of 10:1 and is in an elongated streamlined form. Accordingly, when mounted on the deck of the hull, the solar battery module body 12 conserves space and is not obstructive. In addition, the streamlined form is united with the hull. Consequently, the solar battery module body 12 is better in design than a conventional planar solar battery module.

The solar battery module body 12 includes a transparent case portion 12a, a protective cover portion 12b, and a back lid 12c. The transparent case 12a is provided in the center of the solar battery module body 12 and has its bottom opened so as to accommodate the solar cells 13 therein. The protective cover 12b is provided around the transparent case 12a. The back lid 12c is provided on the bottom of the transparent case 12a.

Figure 4:
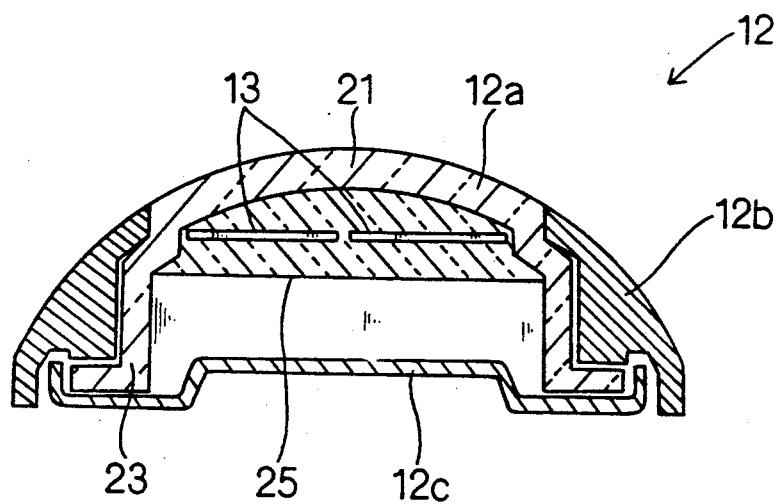
FIG. 4 is a section view taken along the line A—A in FIG. 3.
Figure 5:
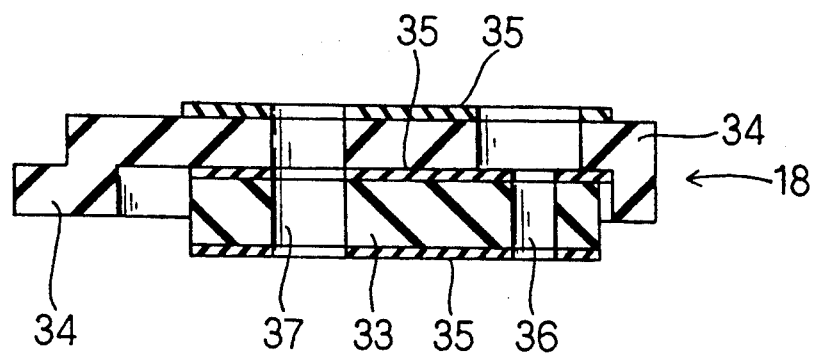
FIG. 5 is a section view of a spacer.
Figure 6:
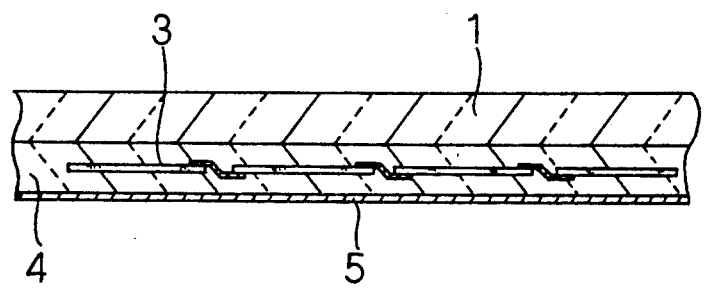
FIG. 6 is a section view of a prior art solar battery module.
Figure 7:
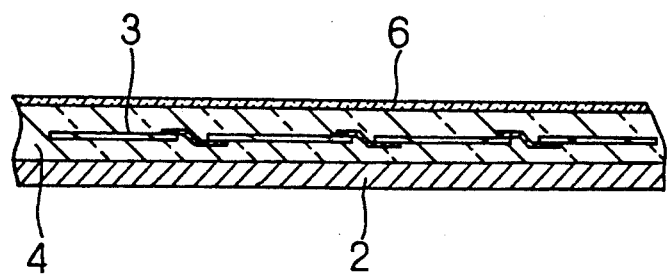
FIG. 7 is a section view of another prior art solar battery module.

The transparent case 12a is made of polycarbonate in order to improve shock resistance. As shown in FIG. 4, a window portion 21 has a circular profile in order to increase the light incident on the solar cells 13 by a lens effect and to improve resistance to shocks caused when the solar battery module body 12 is washed by waves or is tread on.

The protective cover 12b is a colored molded plastic made of polycarbonate.

As shown in FIG. 4, the back lid 12c is contoured to have a U-shaped section so that the hardness is improved. As shown in FIG. 3, a pair of bolts 17 for mounting and the output lead wire 15 are projected from the back lid 12c.

As shown in FIGS. 1 and 4, the solar cells 13 are made of monocrystalline silicon having a high efficiency. A plurality of solar cells 13 are juxtaposed in the upper portion of the transparent case 12a, i.e., in the vicinity of the window portion 21. The solar cells 13 are electrically connected with one another through wires 26. The solar cell 13 at the endmost portion is connected with a drive circuit substrate 28 of a light emitting device (LED) 27 through a lead wire 31.

The soldered portions of the solar cell 13, the LED circuit substrate 28, and the lead wire 31 are encapsulated by a translucent silicone resin 25 and are provided in the upper portion of the solar battery module body 12. Consequently, there is no possibility that seawater or the like flows into the hull so as to corrode the soldered portions.

Figure 2:
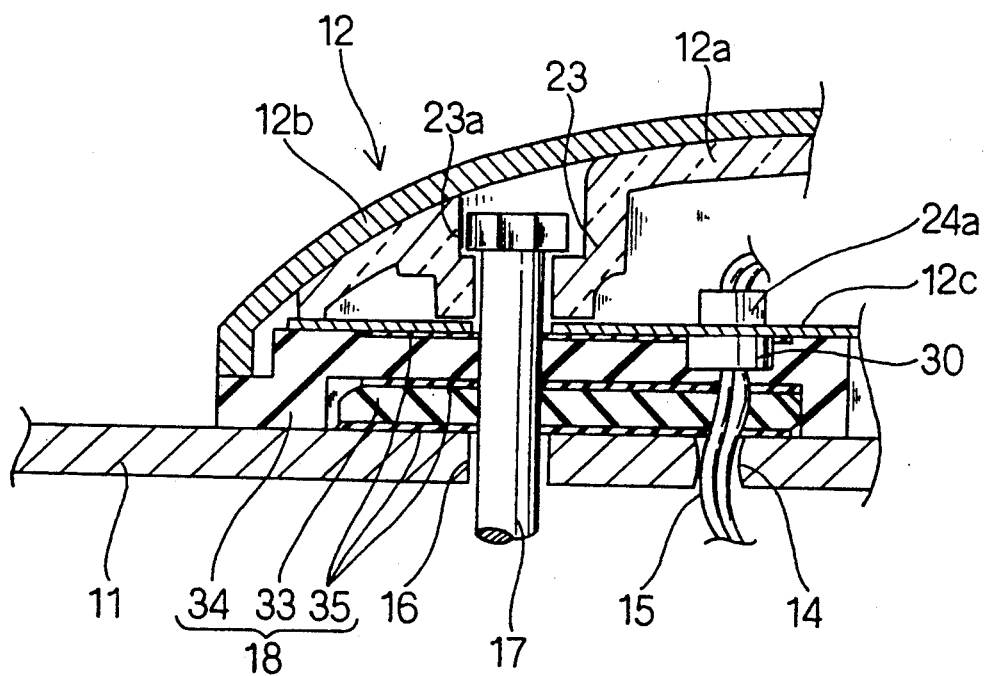
FIG. 2 is a section view showing the solar battery module mounted on a mounting body in the vicinity of a fastener and a connection lead wire.

The LED 27 indicates that the solar cells 13 generate power. When the LED 27 is sealed by a translucent silicone resin 29, its lens effect is lost so that point emission occurs. Consequently, indication of the LED 27 is of poor visibility under sunlight. In order to intercept most of the sunlight incident on the light source of the LED 27, the LED substrate 28 is housed in the lower portion of the transparent case 12a and a window 29a is provided just above the LED 27 as shown in FIG. 1. The window 29a has almost the same diameter as that of the LED 27. Consequently, good visibility can be obtained outdoors irrespective of the point emission. In FIGS. 1 and 2, a bushing is indicated at 30.

The spacers 18 are removably attached to both ends of the solar battery module body 12. One of the spacers 18 has through holes 36 and 37 provided in positions corresponding to the output lead wire 15 and the bolt 17. The other spacer 18 has only the through hole 37 provided in a position corresponding to the bolt 17. Each spacer 18 is formed by stacking a shock absorber 34, a soft foam-type resin 33, and a sealing resin 35. The shock absorber 34 absorbs outer shocks on the lower face of the solar battery module body 12. The soft foaming resin 33 can conformingly adapt to the shape of the mounting face 11. The sealing resin 35 is adherent and waterproof for covering a gap defined around the output lead wire 15 and the bolt 17 so as to prevent water from flowing into the mounting body.

More specifically, the shock absorber 34 and the soft resin 33 are provided on the outside and inside, respectively. The sealing resin 35 is provided on the upper face of the shock absorber 34, on the lower face of the soft resin 33, and between the shock absorber 34 and the soft resin 33, respectively.

The soft resin 33 is made of silicone foam rubber and is projected downward from the shock absorber 34 in a free state. The silicone foam rubber is molded by an independent foaming method. Consequently, all the bubbles in the rubber are independent of one another so that water resistance is not damaged.

The shock absorber 34 is made of a molded silicone rubber having a hardness of about 70 degrees. As shown in FIGS. 1 and 2, a part of the shock absorber 34 projects onto the lower face of the solar battery module body 12 in order to receive the shocks applied to the solar battery module body 12. Consequently, the solar battery module body 12 is supported at two points by the shock absorber 34. The shock absorber 34 has a U-shaped section in order to function as a screen of the soft resin 33 and the sealing resin 35.

The sealing resin 35 is made of an unvulcanized butyl rubber sealant which is a thin film.

With the above-mentioned structure, when the solar battery module body 12 is mounted on the mounting face 11 of the mounting body (hull), the bolt 17 and the output lead wire 15, which are exposed from the back lid 12c of the solar battery module body 12, are inserted into the holes 36 and 37 of the spacer 18. Then, the bolt 17 is fitted in the hole 16 and the output lead wire 15 passes through hole 14. Thereafter, the bolt 17 is tightened by a nut or the like (not shown) on the inside of the hull.

Consequently, the soft resin (foaming silicone rubber) 33 of the spacer 18 conforms to the shape (radius of curvature) of the mounting body 11.

At the same time, the sealing resin (butyl rubber) 35 is compressed to cover or conceal the gap defined around the bolt 17 and the output lead wire 15. In this case, the sealing resin 35 is also provided between the solar battery module body 12 and the spacer 18 and between the hull and the spacer 18. Consequently, water can be prevented from flowing into the hull.

The sealing resin 35 is adherent. Accordingly, even if the bolt 17 is slightly loosened, the sealing resin 35 adheres to the bolt 17 so as to maintain the waterproof condition.

Thus, in the case where the solar battery module body 12 is provided with the spacer 18 having the soft resin 33 and the sealing resin 35, it can be easily and tightly mounted on curved surfaces having various radii of curvature. Accordingly, there can be obtained a solar battery module which may freely be mounted in any place and has good waterproofing.

The solar battery module body 12 is made of polycarbonate having good shock resistance and is in a streamlined form of circular cross section. In addition, a back lid 12c has a U-shaped section. Furthermore, the spacer 18 has the shock absorber 34 for supporting the solar battery module body 12 at two points Consequently, even if the solar battery module is washed by waves or is tread on so that great shocks are applied thereto, the shock resistance is not damaged in any portion of the solar battery module so that the power generation function is maintained.

The present invention is not limited to the above-mentioned embodiment but many modifications and changes may be made to the embodiment without departing from the scope of the invention.

While the solar battery module is mounted on the deck of a yacht, a boat or the like in the above-mentioned embodiment, it may be mounted on a car or the like.

While the spacers 18 can removably be attached to the solar battery module body 12 in the above-mentioned embodiment, they may preliminary be fixed to the solar battery module body 12 by an adhesive or the like.

What is claimed is:

1. A solar battery module adapted to be mounted on a mounting face of a mounting body, comprising;
   a solar battery module body,
   solar cells for converting sunlight into electric energy located inside the solar battery module body,
   a connection lead wire which is connected to the solar cell and adapted to pass through a hole in the mounting face,
   fasteners adapted for passing through holes in the mounting face for mounting the solar battery module body to the mounting face, and
   spacers provided in the vicinity of the fasteners and the connection lead wire contacting the mounting face and for preventing water from flowing into the mounting body and the solar battery module body,
   wherein the spacers include a soft resin adapted to conform to the shape of the mounting face, and a sealing resin, which is adherent and waterproof, provided on both faces of the soft resin for covering or concealing a gap defined around the connection lead wire and the fastener so as to prevent water from flowing into the mounting body.

2. A solar battery module according to claim 1, wherein the soft resin of the spacer is made of silicone foam rubber.

3. A solar battery module according to claim 1, wherein the sealing resin of the spacer is made of butyl rubber.

4. A solar battery module according to claim 1, wherein the soft resin of the spacer is made of silicone foam rubber, and the "floodproof" sealing resin of the spacer is made of butyl rubber and projects onto the lower face of the solar battery module body.

5. A solar battery module according to claim 1, wherein the spacer further includes a shock absorber for absorbing outer shocks on the lower face of the solar battery module body.

6. A solar battery module according to claim 5, wherein the shock absorber of the spacer is made of silicone rubber.

* * * * *